(12) United States Patent
Gatineau et al.

(10) Patent No.: US 10,287,175 B1
(45) Date of Patent: May 14, 2019

(54) METHOD FOR PURIFICATION AND STORAGE OF $TiI_4$ FOR Ti-CONTAINING FILM DEPOSITION

(71) Applicant: L'Air Liquide, Societe Anonyme pour L'Etude et L'Exploitation des Procedes Georges Claude, Paris (FR)

(72) Inventors: Satoko Gatineau, Seoul (KR); Grigory Nikiforov, Kanata (CA)

(73) Assignee: L'Air Liquide Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 578 days.

(21) Appl. No.: 14/983,780

(22) Filed: Dec. 30, 2015

(51) Int. Cl.
  *C01G 23/02* (2006.01)
  *B65B 7/16* (2006.01)
  *B65B 31/00* (2006.01)
(52) U.S. Cl.
  CPC .............. *C01G 23/02* (2013.01); *B65B 7/16* (2013.01); *B65B 31/00* (2013.01)
(58) Field of Classification Search
  CPC .................................................... C01G 23/02
  See application file for complete search history.

(56) References Cited

U.S. PATENT DOCUMENTS

| 5,196,916 | A | * | 3/1993 | Ishigami | ................... | C22B 9/22 |
| | | | | | | 204/298.13 |
| 5,700,519 | A | | 12/1997 | Lam | | |
| 6,090,709 | A | * | 7/2000 | Kaloyeros | ............... | C23C 16/14 |
| | | | | | | 257/E21.168 |
| 6,309,595 | B1 | * | 10/2001 | Rosenberg | .......... | C23C 14/3414 |
| | | | | | | 148/421 |
| 2013/0115383 | A1 | | 5/2013 | Lu et al. | | |

* cited by examiner

*Primary Examiner* — Ngoc-Yen Nguyen
(74) *Attorney, Agent, or Firm* — Patricia E. McQueeney

(57) ABSTRACT

Disclosed are methods for purification of a crude $TiI_4$ for deposition of Ti-containing films including evaporating volatile impurities in the crude $TiI_4$ under vacuum at room temperature in a sublimator and removing the volatile impurities, placing the sublimator in a hot oil bath under vacuum at a temperature to evaporate $TiI_4$ and form powders or a solid, and sublimating the powers or the solid under vacuum at the temperature to obtain the purified $TiI_4$. Disclosed are methods for storage of a pure $TiI_4$ including drying a stainless-steel canister, instantaneously moving the dried stainless steel canister into a glove box under inert atmosphere at room temperature, moving the pure $TiI_4$ into the glove box, filling the pure $TiI_4$ into the dried stainless-steel canister, and sealing the dried stainless steel canister containing the pure $TiI_4$ with metallic sealing.

13 Claims, 3 Drawing Sheets

METHOD FOR PURIFICATION AND STORAGE OF TiI$_4$ FOR Ti-CONTAINING FILM DEPOSITION

TECHNICAL FIELD

Disclosed are methods for purification and storage of a material for deposition of Ti-containing films, in particular, methods for purification and storage of TiI$_4$ for deposition of Ti-containing films.

BACKGROUND

For semiconductor chip manufacturing, a quality of materials is a key point to maintain constant and high quality of products. Titanium halide compounds, such as TiCl$_4$ and TiI$_4$, have been used as materials for deposition of Ti and TiN films in chip manufacturing industries. See, e.g., US2013/0115383 to Xinliang Lu et al.

TiI$_4$ is very sensitive to the air and its quality needs to be controlled well for its usage in order to keep constant and high performance during manufacturing processes in semiconductors. U.S. Pat. No. 5,700,519 to Lam discloses a method for depositing ultra high purity titanium films by generating gaseous TiI$_4$ in situ by reacting titanium metal starting material with gaseous iodide in a reaction chamber and purifying the TiI$_4$ by a double distillation process to produce ultra high purity of greater than 99.998% TiI$_4$.

A need remains for methods of purifying and storing TiI$_4$ so that it is of suitable purity for vapor deposition of Titanium-containing films.

SUMMARY

Disclosed are methods for purification of crude TiI$_4$ for deposition of Ti-containing films, the method comprising the steps of introducing the crude TiI$_4$ into a sublimator having a cold trap cooled by liquid nitrogen, evaporating volatile impurities in the crude TiI$_4$ under vacuum at room temperature in the sublimator and collecting the evaporated volatile impurities in the cold trap, removing the volatile impurities, placing the sublimator, after the step of removing the volatile impurities, in a hot oil bath under vacuum at a temperature to evaporate TiI$_4$ and form powders or a solid in the cold trap of the sublimator, and sublimating the powers or the solid under vacuum at the temperature to obtain the purified TiI$_4$.

Also disclosed are methods for storage of a pure TiI$_4$ for deposition of Ti-containing films, the method comprising drying a stainless-steel canister at a temperature more than 100° C. for a period of time, instantaneously moving the dried stainless steel canister into a glove box under inert atmosphere at room temperature, moving the pure TiI$_4$ into the glove box without any contact with air, filling the pure TiI$_4$ into the dried stainless-steel canister in the glove box, and sealing the dried stainless steel canister containing the pure TiI$_4$ with metallic sealing in the glove box.

Notation and Nomenclature

The following detailed description and claims utilize a number of abbreviations, symbols, and terms, which are generally well known in the art. While definitions are typically provided with the first instance of each acronym, for convenience, Table 1 provides a list of the abbreviations, symbols, and terms used along with their respective definitions.

TABLE 1

| | |
|---|---|
| a or an | One or more than one |
| Approximately or about | ±10% of the value stated |
| CVD | chemical vapor deposition |
| LPCVD | low pressure chemical vapor deposition |
| PCVD | pulsed chemical vapor deposition |
| SACVD | sub-atmospheric chemical vapor deposition |
| PECVD | plasma enhanced chemical vapor deposition |
| APCVD | atmospheric pressure chemical vapor deposition |
| HWCVD | hot-wire chemical vapor deposition |
| Flowable PECVD | flowable plasma enhanced chemical vapor deposition |
| MOCVD | metal organic chemical vapor deposition |
| ALD | atomic layer deposition |
| spatial ALD | spatial atomic layer deposition |
| HWALD | hot-wire atomic layer deposition |
| PEALD | plasma enhanced atomic layer deposition |
| MP | melting point |
| TGA | thermogravimetric analysis |
| TG-DTA | thermogravimetric differential thermal analysis |
| DTA | differential thermal analysis |
| PTFE | Polytetrafluoroethylene |
| PFA | Perfluoroethers |

Please note that the films or layers deposited, such as titanium oxide or titanium nitride, may be listed throughout the specification and claims without reference to their proper stoichiometry (i.e., TiO$_2$, TiO$_3$, Ti$_3$N$_4$). The layers may include pure (Ti) layers, carbide (Ti$_o$C$_p$) layers, nitride (Ti$_k$N$_l$) layers, oxide (Ri$_n$O$_m$) layers, or mixtures thereof, wherein k, l, m, n, o, and p inclusively range from 1 to 6. For instance, titanium oxide is Ti$_n$O$_m$, wherein n ranges from 0.5 to 1.5 and m ranges from 1.5 to 3.5. More preferably, the titanium oxide layer is TiO$_2$ or TiO$_3$.

Any and all ranges recited herein are inclusive of their endpoints (i.e., purity ranging from 99% w/w to 100% w/w includes a purity of 99% w/w, a purity of 100% w/w, and any purities between the two (i.e., 99.1, 99.2, 99.353, etc.)).

The standard abbreviations of the elements from the periodic table of elements are used herein. It should be understood that elements may be referred to by these abbreviations (e.g., Si refers to silicon, N refers to nitrogen, O refers to oxygen, C refers to carbon, etc.).

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DESCRIPTION OF PREFERRED EMBODIMENTS

Disclosed are methods of purifying and maintaining purity of $TiI_4$ for deposition of Ti-containing films in semiconductor industries.

The quality of $TiI_4$ for producing Ti-containing films is the key point for deposition of Ti-containing films. To meet this requirement, the purity of $TiI_4$ should range from approximately 99% w/w to approximately 100% w/w, and preferably greater than 99.9% w/w. The non-volatile impurities of $TiI_4$ should range from 0% w/w to approximately 1% w/w, preferably less than 0.5% w/w. The amount of $I_2$ and/or HI contained in $TiI_4$ should be range from 0% w/w to approximately 1% w/w, preferably less than 0.5% w/w.

The purity of $TiI_4$ used for the deposition of Ti-containing films is normally guaranteed from suppliers, but other impurities are usually not mentioned. For example, the purity of $TiI_4$ may be shown as 95% w/w. Due to the stringent requirements for the purity of $TiI_4$ for deposition of Ti-containing films, the other 5% w/w impurities must be removed.

Figure 1:
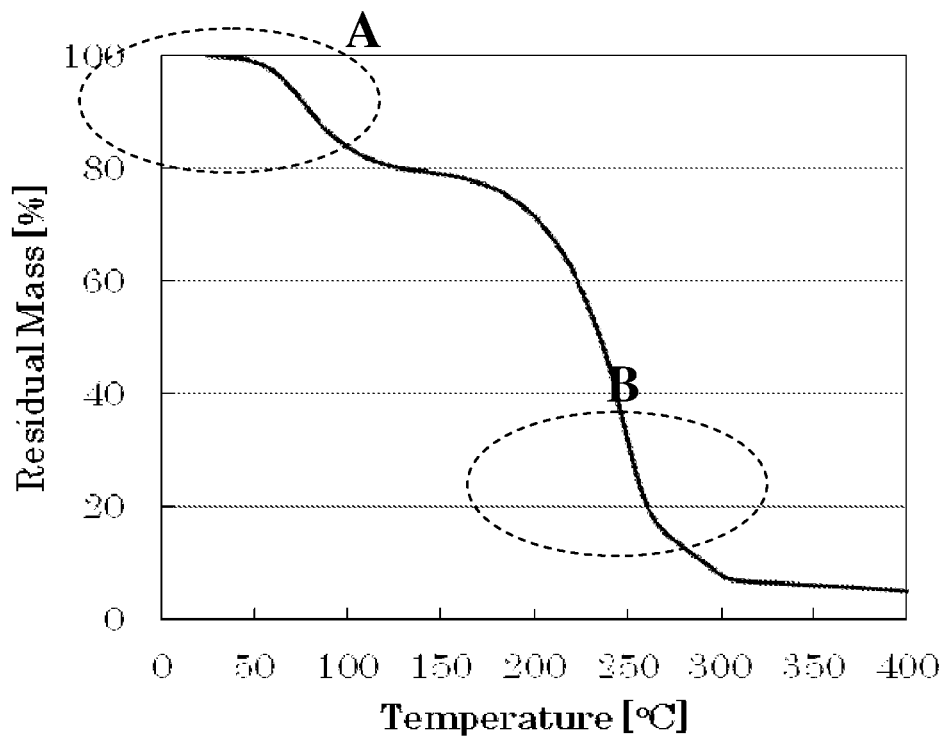
FIG. 1 is a ThermoGravimetric Analysis (TGA) graph demonstrating the percentage of weight loss with increasing temperature of TiI$_4$ in air.

FIG. 1 is a ThermoGravimetric Analysis (TGA) curve of $TiI_4$ in air showing the percentage of weight loss with increasing temperature. A $TiI_4$ sample with a purity of 95% w/w in air was analyzed by TGA. $TiI_4$ decomposes in air, forming $I_2$ and/or HI, and $TiO_mI_n$, wherein $0<m<2$ and $0<n<4$.

As shown in FIG. 1, part A indicates the presence of $I_2$ and/or HI in $TiI_4$ in air and part B indicates the presence of $TiO_mI_n$ compounds in $TiI_4$ in air. Since $TiI_4$ tends to decompose in air, the decomposed compounds of $TiI_4$ (i.e., $I_2$, HI and/or $TiO_mI_n$) prevent the supply of a constant vapor of $TiI_4$ when $TiI_4$ is heated and makes the deposition process unreliable for deposition of Ti-containing films in semiconductor industries. When $TiI_4$ is purified and the impurities in $TiI_4$ are removed, $TiI_4$ evaporates smoothly.

The impurities existing in $TiI_4$ may include volatile impurities, such as $I_2$ and/or HI, and non-volatile impurities, such as $TiO_mI_n$. As such, the purification methods include the steps of evaporating the volatile impurities to remove the volatile impurities and sublimating $TiI_4$ to separate $TiI_4$ from the non-volatile impurities, respectively.

The disclosed methods for purification of $TiI_4$ includes introducing $TiI_4$ into a sublimator having a cold trap cooled by liquid nitrogen, evaporating volatile impurities in the $TiI_4$ under vacuum at room temperature in the sublimator and collecting the evaporated volatile impurities in the cold trap, removing the volatile impurities from the cold trap, placing the sublimator, after the step of removing the volatile impurities, in a hot oil bath under vacuum at a temperature to evaporate $TiI_4$ and form powders or a solid in the cold trap of the sublimator, and sublimating the powders or the solid under vacuum at the temperature to obtain the purified $TiI_4$.

Herein, the $TiI_4$ starting material may have a purity ranging from approximately 90% w/w to approximately 95% w/w. The volatile impurities may include $I_2$ and/or HI. The vacuum placed on the sublimator may range between approximately 1 mTorr (0.13 Pa) to approximately 10 mTorr (1.3 Pa), more preferably between approximately 2 mTorr (0.27 Pa) to approximately 8 mTorr (1.1 Pa). The sublimator is heated to a temperature higher than the melting point of $TiI_4$, ranging from approximately 150° C. to approximately 190° C.

The purified $TiI_4$ may have a purity ranging from approximately 99% w/w to approximately 100% w/w, preferably greater than 99.9% w/w. The amount of non-volatile impurities contained in the purified $TiI_4$ may range from 0% w/w to approximately 1% w/w, preferably less than 0.5% w/w. The amount of $I_2$ and/or HI contained in the purified $TiI_4$ may range from 0% w/w to approximately 1% w/w, preferably less than 0.5% w/w. One of ordinary skill in the art will recognize that the purity may be determined by H NMR or gas or liquid chromatography with mass spectrometry.

The disclosed methods for storage of a purified $TiI_4$ include drying a stainless steel canister at a temperature, ranging from approximately 100° C. to approximately 200° C., for 3 hours to 24 hours, instantaneously moving the dried stainless steel canister into a glove box, moving the purified $TiI_4$ into the glove box without any contact with air, filling the purified $TiI_4$ in the dried stainless steel canister in the glove box and sealing the well-dried stainless steel canister containing the purified $TiI_4$ with metallic sealing. The glove box may be an inert atmosphere glove box operated at room temperature in which moisture level is highly controlled between 0 ppmv and approximately 5 ppmv (dew point $-65°$ C.), preferably less than 1 ppm (dew point $-76°$ C.). The inert gas may be selected from $N_2$ or Ar. The dried stainless steel canister may be moved into the glove box promptly after drying without exposure to the air for a long time to avoid water re-condensation on the stainless steel canister.

A dried stainless steel canister with metallic sealing is suitable for storing $TiI_4$. Other materials, such as Plastic, PTFE, PFA, may contain moisture and it is difficult to remove moisture from these materials by heating. As a result, any material from which it is difficult to remove moisture is not preferred as a component of the storage vessel, including any sealing and capping parts.

Figure 2:
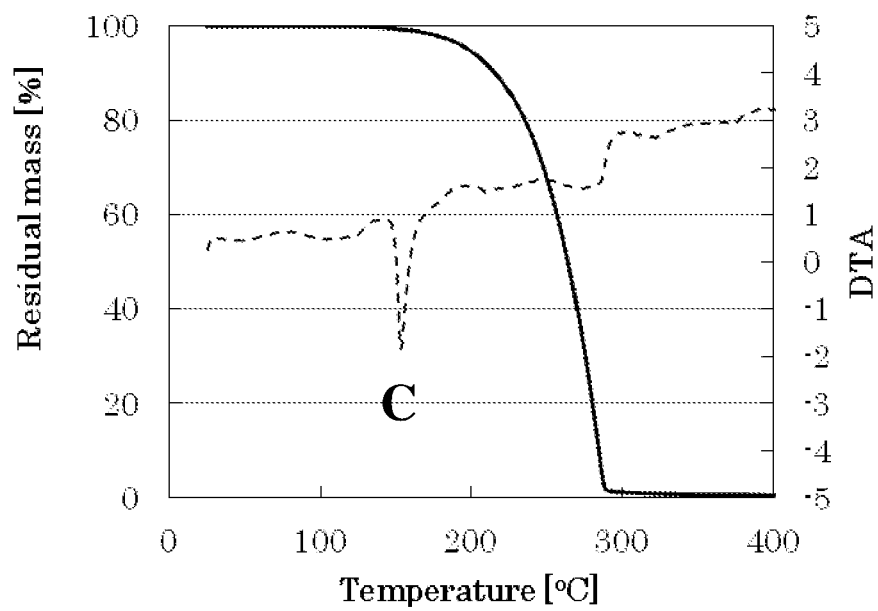
FIG. 2 is a ThermoGravimetric-Differential Thermal Analysis (TG-DTA) graph demonstrating the percentage of weight loss (TG) and the differential temperature (DT) with increasing temperature of purified TiI$_4$.

FIG. 2 is a Themogravimetric-Differential Thermal Analysis (TG-DTA) curve of a purified $TiI_4$ after removing impurities. The purified $TiI_4$ sample has a purity of 95% w/w $TiI_4$. As shown in FIG. 2, the melting point (150° C.) of $TiI_4$ is indicated as peak C in a DTA curve.

Figure 3:
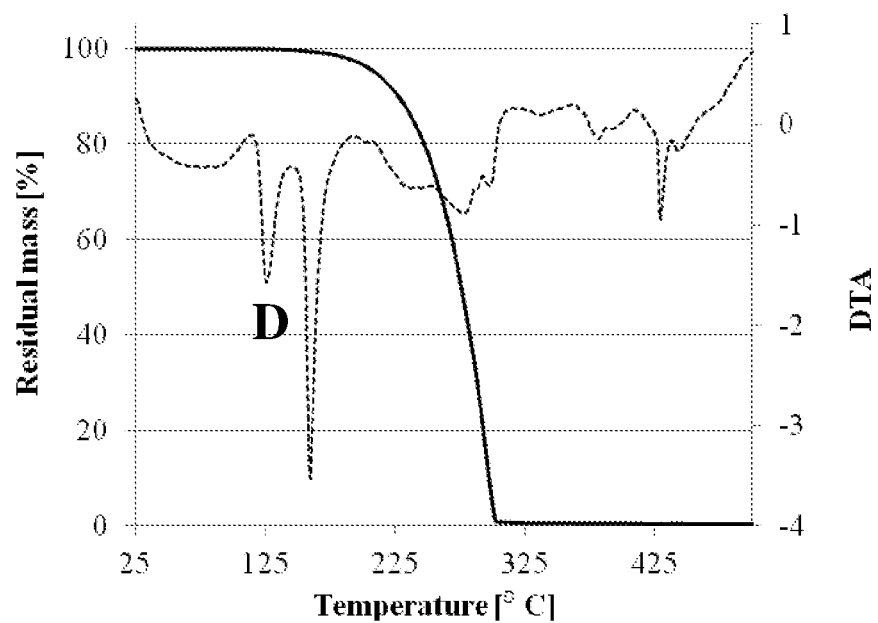
FIG. 3 is a TG-DTA graph demonstrating the percentage of weight loss (TG) and the differential temperature (DT) with increasing temperature of decomposed TiI$_4$.

However when the purified $TiI_4$ sample is stored with a small amount of moisture, the purified $TiI_4$ sample starts decomposing and new DTA peak D appeared at lower temperature (126° C.) than the melting point C (150° C.), as shown in FIG. 3. FIG. 3 is a TG-DTA curve of decomposed $TiI_4$. Although the TG curve of $TiI_4$ does not change comparing to the purified $TiI_4$, generation of impurities is observed (e.g., peak D). Purifying the decomposed $TiI_4$ sample one more time, the peak D in the TG-DTA curve disappears.

Figure 4:
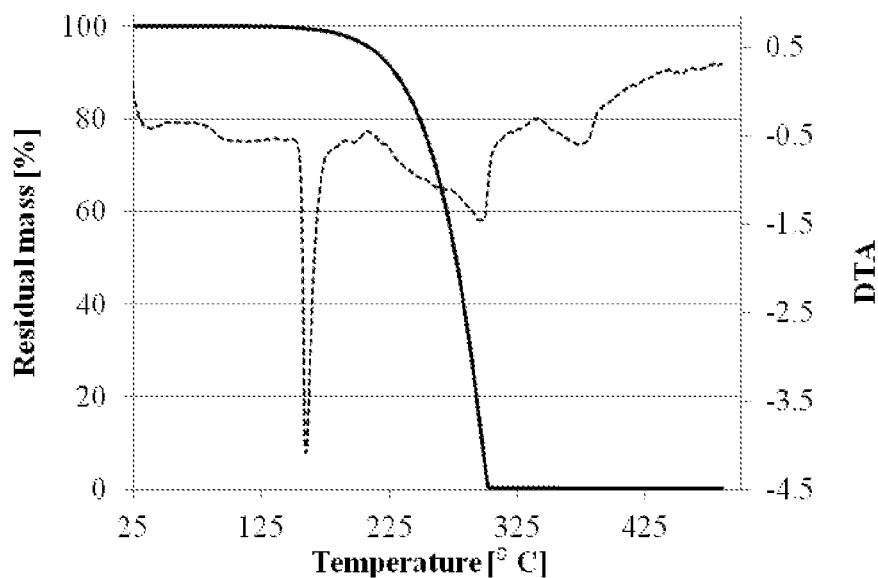
FIG. 4 is a TG-DTA graph demonstrating the percentage of weight loss (TG) and the differential temperature (DT) with increasing temperature of purified TiI$_4$ stored for one month.
Figure 5:
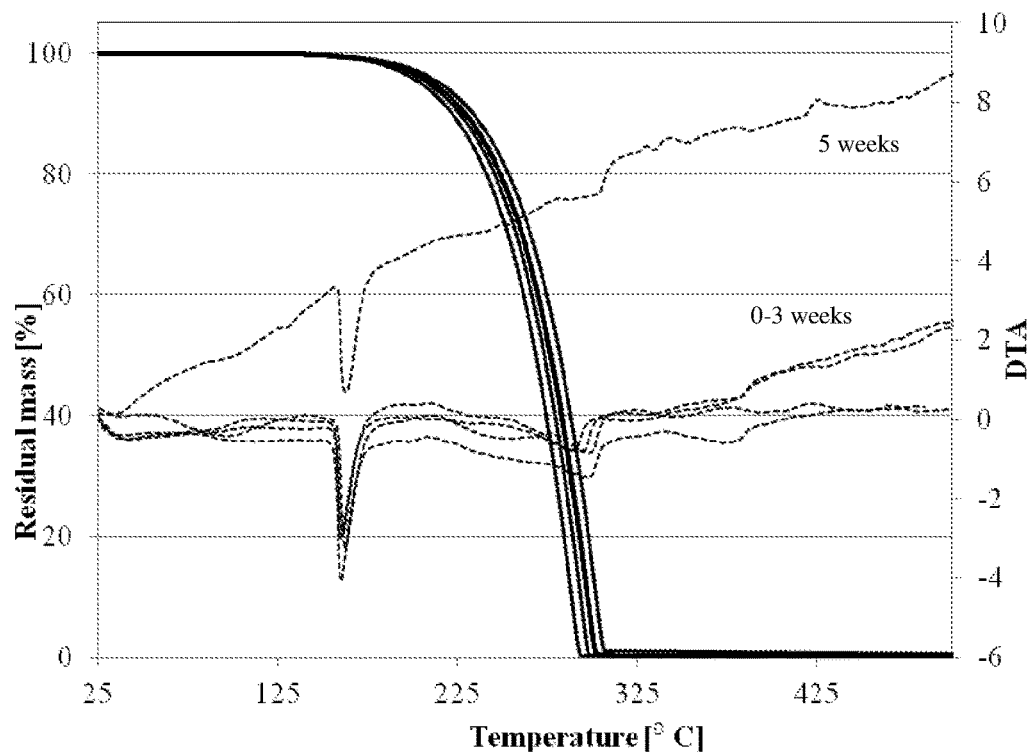
FIG. 5 is a TG-DTA graph demonstrating the percentage of weight loss (TG) and the differential temperature (DT) with increasing temperature of purified TiI$_4$ isolated from moisture and oxygen for 5 weeks.
Figure 6:
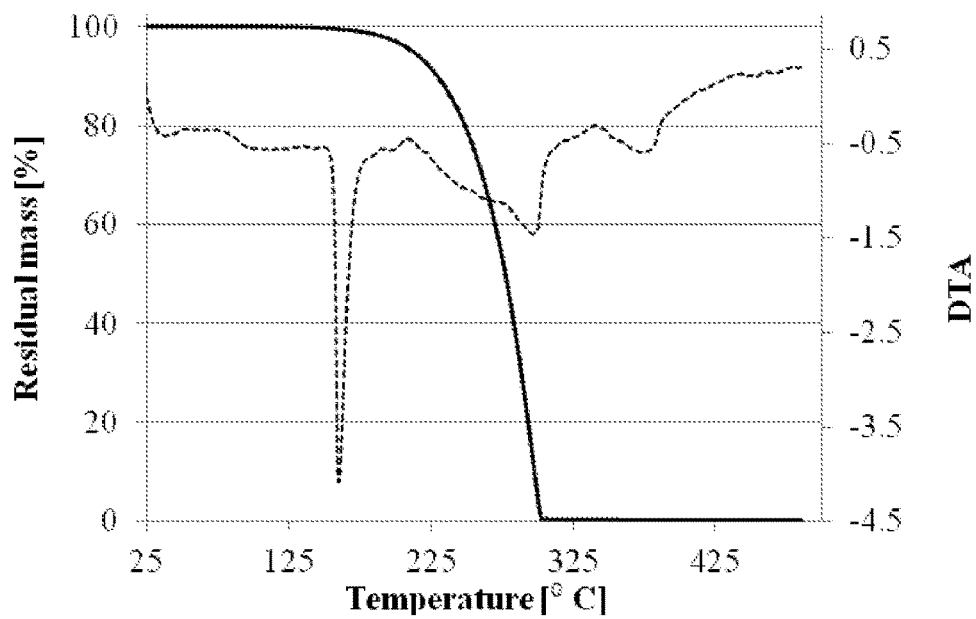
FIG. 6 is a TG-DTA graph demonstrating the percentage of weight loss (TG) and the differential temperature (DT) with increasing temperature of a purified $TiI_4$ under atmospheric pressure.

Alternatively, when the purified $TiI_4$ sample is stored away from moisture and oxygen, the peak D in the TG-DTA curve does not appear after long term storage, for example, one month, as shown in FIG. 4. FIG. 4 is a TG-DTA curve of a purified $TiI_4$ stored for one month. The peak D does not appear in FIG. 4, even when the $TiI_4$ sample is heated in well-closed canister at 140° C. As long as the purified $TiI_4$ sample is isolated from moisture and oxygen, the peak D does not appear after several weeks, e.g., 5 weeks, so that the quality of $TiI_4$ is retained. FIG. 5 is a set of TG-DTA curves of a purified $TiI_4$ stored isolated from moisture and oxygen for 5 weeks. As shown in FIG. 5, there is no extra impurity peak generated during the 5 weeks.

EXAMPLES

The following non-limiting examples are provided to further illustrate embodiments of the invention. However, the examples are not intended to be all inclusive and are not intended to limit the scope of the inventions described herein.

Example 1

Purification of Crude $TiI_4$ $TiI_4$ (25 g) was purified by sublimation under vacuum in a sublimator. The sublimator has a cold trap, or finger, cooled by liquid nitrogen. When vacuum (e.g., 8 mTorr or 1.1 Pa) was applied to the apparatus at room temperature, volatile impurities started to sublime and were collected in the cold trap. The volatile impurities include $I_2$ and/or HI.

After all volatile impurities were removed, the apparatus was then immersed in a hot oil bath at 180° C. and under vacuum, for example, 2-6 mTorr. Dark brown powder or a solid was formed and attached on the cold trap of the apparatus. The dark brown powder or the solid was collected and purified one more time by sublimation at 180° C. at 2-6 mTorr. Then pure $TiI_4$ (~21.9 g) was obtained yielding 87.6% w/w of pure $TiI_4$.

Example 2

Measurement of Purity

The purified $TiI_4$ was analyzed by TG-DTA under atmospheric pressure (e.g., 1010 mbar or 101 kPa). Purge gas was Nitrogen at 220 sccm. Pan was Al. FIG. 2, FIG. 4 and FIG. 5 are the exemplary TG-DTA curves of a purified $TiI_4$ at different time periods after purification.

Example 3

Storage of Purified $TiI_4$

The purified $TiI_4$ is air sensitive and contamination by even a small amount of moisture and oxygen is not acceptable. The purified $TiI_4$ should be stored in a dried stainless steel (SS) canister or tube with metallic sealing.

The stainless steel canister was dried at 125° C. for at least 3 hours. The dried stainless steel canister instantaneously was moved into an inert atmosphere (e.g., Ar) glove box without exposure to the air for a long time to avoid water re-condensation on the stainless steel canister. Moisture level in the glove box was highly controlled for less than 5 ppmv. The purified $TiI_4$ was moved into the glove box without any contact with air and then filled in the dried stainless steel canister in the glove box. The dried stainless steel canister containing the purified $TiI_4$ was then sealed with metallic sealing.

Example 4

Example for Usage of $TiI_4$

The purified $TiI_4$ may be used for Ti-containing film deposition, preferably Ti and TiN film depositions.

The disclosed purified $TiI_4$ may be used to deposit Ti-containing films using any deposition methods known to those of skill in the art. Examples of suitable deposition methods include chemical vapor deposition (CVD) or atomic layer deposition (ALD). Exemplary CVD methods include thermal CVD, pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, plasma enhanced CVD (PECVD) including but not limited to flowable PECVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

The disclosed purified $TiI_4$ may be used to deposit Ti-containing films with a co-reactant. The co-reactant may be selected from $H_2$, $NH_3$, $AlMe_3$, $AlEt_3$, $AliBu_3$, $HAlMe_2$, $H_3AlNEt_2Me$, $H_3AlNMe_3$, $(BH_4)AlH_2NMe_3$, $H_3Al(Me-NC_4H_8)$, other alanes, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, $B_2H_6$, 9-borabicyclo[3,3,1]nonane, dihydrobenzofuran, pyrazoline, triethylaluminum, triethylaluminum, dimethylzinc, diethylzinc, radical species thereof, and mixtures thereof. Preferably, the reducing agent is $H_2$, $NH_3$, $SiH_4$, $Si_2H_6$, $Si_3H_8$, $SiH_2Me_2$, $SiH_2Et_2$, $N(SiH_3)_3$, or their mixtures.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

We claim:

1. A method for purification of $TiI_4$ for deposition of Ti-containing films, the method comprising the steps of:
   introducing $TiI_4$ into a sublimator having a cold trap cooled by liquid nitrogen;
   evaporating volatile impurities in the $TiI_4$ under vacuum at room temperature to produce semi-purified $TiI_4$ and collecting the evaporated volatile impurities in the cold trap;
   removing the evaporated volatile impurities from the cold trap;
   placing the sublimator containing the semi-purified $TiI_4$ in a hot oil bath under vacuum at a temperature to evaporate $TiI_4$ and form a powder or solid in the cold trap; and
   sublimating the powder or solid under vacuum at the temperature to obtain the purified $TiI_4$.

2. The method of claim 1, wherein the crude $TiI_4$ has a purity ranging from approximately 90% w/w to approximately 95% w/w.

3. The method of claim 1, wherein the temperature ranges from approximately 150° C. to approximately 190° C.

4. The method of claim 3, wherein the temperature is 180° C.

5. The method of any claim of 1, wherein the volatile impurity is $I_2$.

6. The method of any claim of 1, wherein the volatile impurity is HI.

7. The method of claim 1, wherein the purified $TiI_4$ has a purity of 99% w/w.

8. The method of claim 1, wherein the purified $TiI_4$ has a purity ranging from approximately 99% w/w to approximately 100% w/w.

9. The method of claim 1, wherein the purified $TiI_4$ has a purity ranging from approximately 99.9% w/w to approximately 100.0% w/w.

10. The method of claim 1, wherein the purified $TiI_4$ contains between 0% w/w and approximately 1% w/w non-volatile impurities.

11. The method of claim 1, wherein the purified $TiI_4$ contains between 0% w/w and approximately 0.5% w/w non-volatile impurities.

12. The method of claim 1, wherein the purified $TiI_4$ contains between 0% w/w and approximately 1% w/w $I_2$ and/or HI.

13. The method of claim 1, wherein the purified $TiI_4$ contains between 0% w/w and approximately 0.5% w/w $I_2$ and/or HI.

\* \* \* \* \*